(12) United States Patent
Yamada et al.

(10) Patent No.: US 10,901,028 B2
(45) Date of Patent: Jan. 26, 2021

(54) SUBSTRATE INSPECTION METHOD AND SUBSTRATE INSPECTION DEVICE

(71) Applicant: TOKYO ELECTRON LIMITED, Tokyo (JP)

(72) Inventors: Hiroshi Yamada, Nirasaki (JP); Jun Fujihara, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 132 days.

(21) Appl. No.: 16/333,737

(22) PCT Filed: Aug. 25, 2017

(86) PCT No.: PCT/JP2017/031505
§ 371 (c)(1),
(2) Date: Mar. 15, 2019

(87) PCT Pub. No.: WO2018/056022
PCT Pub. Date: Mar. 29, 2018

(65) Prior Publication Data
US 2019/0271738 A1    Sep. 5, 2019

(30) Foreign Application Priority Data
Sep. 21, 2016    (JP) ................................. 2016-184258

(51) Int. Cl.
*G01R 31/28* (2006.01)
*G01R 1/073* (2006.01)

(52) U.S. Cl.
CPC ..... *G01R 31/2831* (2013.01); *G01R 1/07342* (2013.01); *G01R 31/28* (2013.01)

(58) Field of Classification Search
CPC ............ G01R 31/2886; G01R 31/2887; G01R 1/07342; G01R 1/0735; G01R 31/2831;
(Continued)

(56) References Cited

U.S. PATENT DOCUMENTS 6,373,271 B1 * 4/2002 Miller ................ G01R 31/2886
324/750.14
6,468,098 B1 * 10/2002 Eldridge .............. G01R 1/0735
439/197
(Continued)

FOREIGN PATENT DOCUMENTS

JP          200222768 A    1/2002
JP          4553841 B2     9/2010
(Continued)

*Primary Examiner* — Vinh P Nguyen
(74) *Attorney, Agent, or Firm* — Nath, Goldberg & Meyer; Jerald L. Meyer

(57) ABSTRACT

Provided is a substrate inspection method capable of accurately performing inspection. A wafer inspection device includes a chuck top on which a wafer having a semiconductor device formed thereon is mounted and a probe card disposed above the chuck top so as to face the chuck top. The probe card includes a plurality of contact probes protruding toward the wafer. When bringing the chuck top close to the probe card, a tubular expandable/contractible bellows extending downward from the probe card side so as to surround the contact probes is attracted to the chuck top via a lip seal before the contact probes come into contact with the semiconductor device.

8 Claims, 9 Drawing Sheets

(58) Field of Classification Search
CPC .......... G01R 31/2851; G01R 31/2863; G01R 1/07314; G01R 31/2865; G01R 31/31905; G01R 1/073; G01R 31/28; G01R 31/2881; H01R 12/57; H01R 12/714; H01R 12/853; H01R 13/2407
See application file for complete search history.

(56) References Cited

U.S. PATENT DOCUMENTS

| | | | |
|---|---|---|---|
| 9,041,424 B2* | 5/2015 | Yamada | G01R 1/0491 |
| | | | 324/756.03 |
| 2020/0225282 A1* | 7/2020 | Fujihara | G01R 31/2887 |

FOREIGN PATENT DOCUMENTS

| | | | |
|---|---|---|---|
| JP | 2013254812 A | | 12/2013 |
| JP | 201646285 A | | 4/2016 |
| KR | 10-2015-0064061 A | | 6/2015 |
| KR | 10-2016-0022775 A | | 3/2016 |
| WO | 2012026036 A1 | | 3/2012 |

* cited by examiner

SUBSTRATE INSPECTION METHOD AND SUBSTRATE INSPECTION DEVICE

This is a National Phase Application filed under 35 U.S.C. 371 as a national stage of PCT/JP2017/031505, filed Aug. 25, 2017, an application claiming the benefit of Japanese Application No. 2016-184258, filed Sep. 21, 2016, the content of each of which is hereby incorporated by reference in its entirety.

TECHNICAL FIELD

The present disclosure relates to a substrate inspection method and a substrate inspection device.

BACKGROUND

In order to inspect a wafer on which a large number of semiconductor devices are formed, a prober is used as an inspection device. The prober includes a probe card facing a wafer. The probe card includes a plate-shaped base portion and a plurality of contact probes (probe needles) as columnar contact terminals arranged in the base portion so as to face respective electrode pads or respective solder bumps of a semiconductor device of a wafer (see, for example, Patent Document 1).

In the prober, the respective contact probes of the probe card are brought into contact with the electrode pads or the solder bumps of the semiconductor device by pressing the wafer against the probe card using a stage on which the wafer is placed. Then, electricity is made to flow from the respective contact probes to the electric circuit of the semiconductor device connected to the respective electrode pads or the respective solder bumps, thereby inspecting the electrical characteristics such as a conduction state of the electric circuit and the like.

Furthermore, when pressing the wafer against the probe card using the stage, both the stage and the probe card are required to have high rigidity to counteract the pressing load of the stage. The cost increases along with the increase in the rigidity. Thus, there has been proposed a substrate inspection device in which, as shown in FIG. 7A, a wafer W is placed on a chuck 70 made of a plate-shaped member, a closed space S surrounded by a seal member 72 is formed between the chuck 70 and a probe card 71, the closed space S is depressurized and contracted to draw the wafer W together with the chuck 70 toward the probe card 71 (FIG. 7B), and the wafer W is brought into contact with the probe card 71 (see, for example, Patent Document 2). In this substrate inspection device, there is no need to press the wafer W against the probe card 71 using a stage. Therefore, it is possible to eliminate the need to increase the rigidity of the probe card 71 and the chuck 70 to counteract the pressing load of the stage.

PRIOR ART DOCUMENTS

Patent Documents

Patent Document 1: Japanese laid-open publication No. 2002-22768

Patent Document 2: International Publication No. 2012/026036

However, there is a case where the semiconductor device of the wafer W to be inspected is formed at a position offset from the center of the wafer W. In general, the wafer W is mounted on the chuck 70 so that the center of the wafer W coincides with the center of the chuck 70. Therefore, in this case, a reaction force from the respective contact probes 73 of the probe card 71 acts at the position offset from the center of the chuck 70. As a result, a moment may act on the chuck 70, and the chuck 70 may be tilted (FIG. 7C). In the case where the respective contact probes 73 are of a cantilever type, the reaction force from the respective contact probes 73 is obliquely applied to the wafer W. Thus, the chuck 70 is pushed down and may also be moved laterally (see a broken line in FIG. 7D).

As a result, the respective contact probes 73 cannot properly make contact with the respective electrode pads or the respective solder bumps. This may make it impossible to accurately inspect the electrical characteristics of the semiconductor device.

The present invention provides some embodiments of a substrate inspection method and substrate inspection device capable of accurately performing inspection.

SUMMARY

According to one embodiment of the present disclosure, there is provided a substrate inspection method for use in a substrate inspection device including a plate-shaped member on which a substrate having a device formed thereon is mounted and a probe card disposed above the plate-shaped member so as to face the plate-shaped member, the probe card including a plurality of needle-shaped contact probes protruding toward the substrate, the substrate inspection device configured to bring the plate-shaped member close to the probe card to bring the contact probes into contact with the device, the substrate inspection method including: arranging a tubular expandable/contractible bellows extending downward so as to surround the plurality of needle shaped contact probes; arranging a lip seal having a U-shaped cross section opened toward the bellows on the plate-shaped member so as to surround the substrate; arranging a stopper inside the lip seal; and attracting the bellows to the lip seal when bringing the plate-shaped member close to the probe card, before the contact probes come into contact with the device.

According to another embodiment of the present disclosure, there is provided a substrate inspection device including a plate-shaped member on which a substrate having a device formed thereon is mounted and a probe card disposed above the plate-shaped member so as to face the plate-shaped member, the probe card including a plurality of needle-shaped contact probes protruding toward the substrate, the substrate inspection device configured to bring the plate-shaped member close to the probe card to bring the contact probes into contact with the device, the substrate inspection device comprising: a tubular expandable/contractible bellows extending downward so as to surround the plurality of needle shaped contact probes; and a lip seal disposed on the plate-shaped member so as to surround the substrate, wherein the lip seal has a U-shaped cross section opened toward the bellows, a stopper is arranged inside the lip seal, and the bellows is attracted to the lip seal when bringing the plate-shaped member close to the probe card, before the contact probes come into contact with the device.

According to the present disclosure, when bringing the plate-shaped member close to the probe card, a tubular bellows extending downward from the probe card side so as to surround the respective contact probes is attracted to the lip seal before the respective contact probes make contact with the device. Therefore, the bellows can be rigidly integrated with the plate-shaped member before the respective contact probes come into contact with the device. Even if the reaction force from the respective contact probes acts on the plate-shaped member via the device after the respective contact probes make contact with the device, the rigidity of the bellows can be contributed to counteract the reaction force. Thus, it is possible to prevent the plate-shaped member from being tilted or laterally moved by the reaction force, whereby the respective contact probes can be appropriately brought into contact with the respective electrode pads or the respective solder bumps of the device. As a result, it is possible to accurately inspect the device.

DETAILED DESCRIPTION

Embodiments of the present disclosure will now be described with reference to the drawings.

First, a wafer inspection device as a substrate inspection device according to the embodiment will be described.

Figure 1:
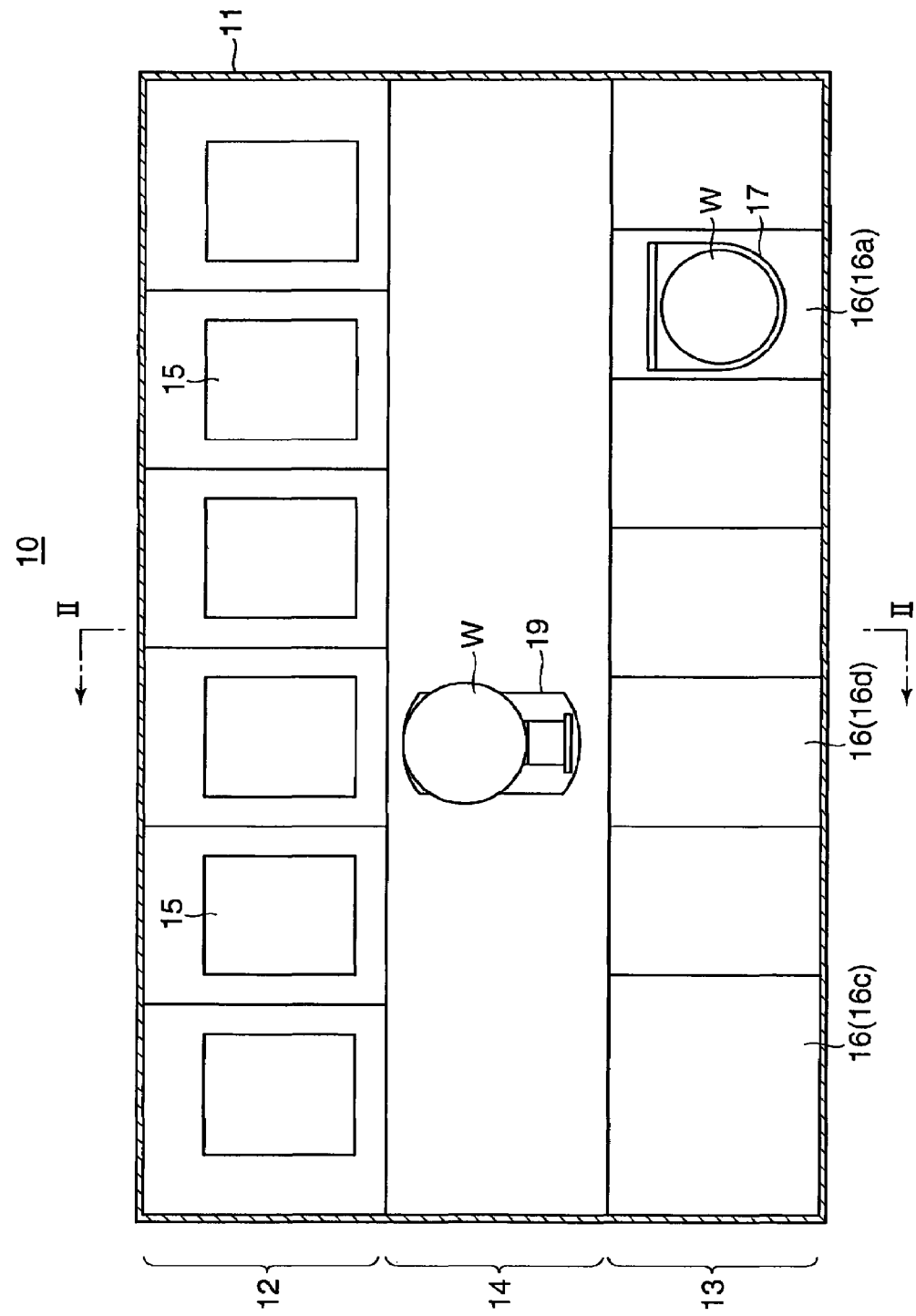
FIG. 1 is a horizontal sectional view schematically showing a configuration of a wafer inspection device as a substrate inspection device according to an embodiment of the present disclosure.
Figure 2:
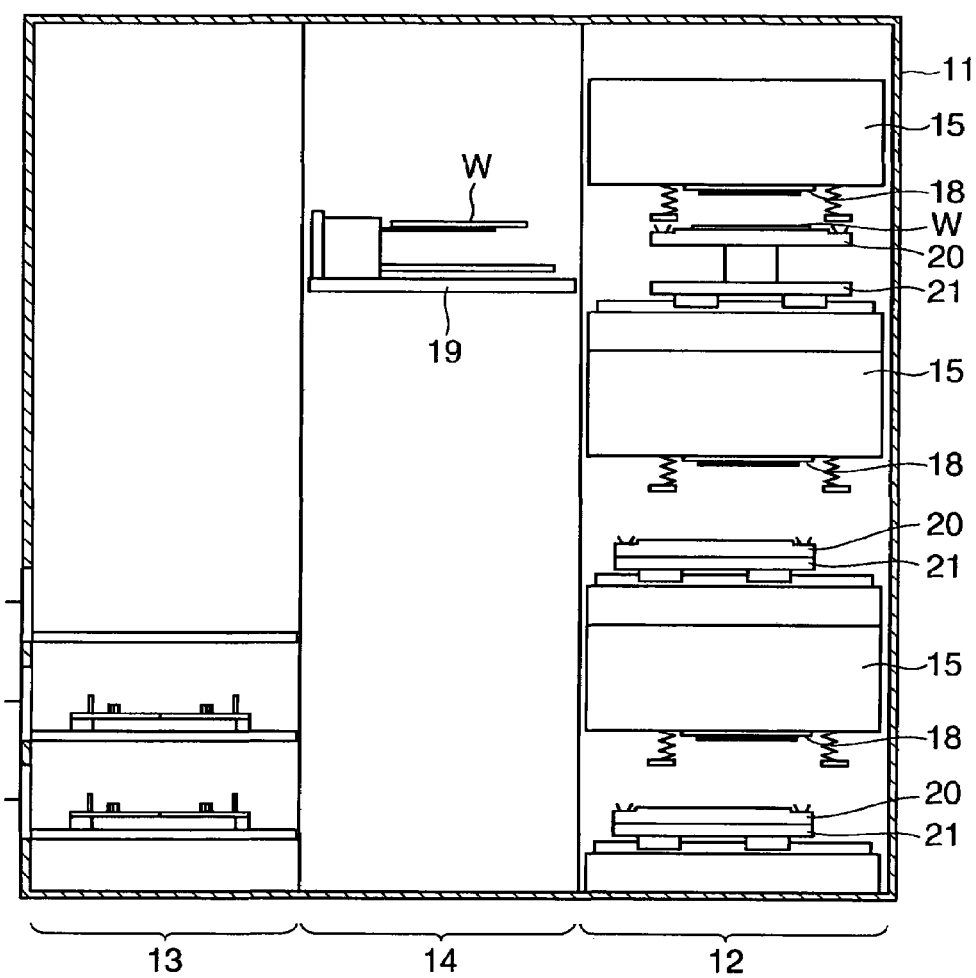
FIG. 2 is a vertical sectional view taken along line II-II in FIG. 1.

FIG. 1 is a horizontal sectional view schematically showing a configuration of a wafer inspection device as a substrate inspection device according to an embodiment of the present disclosure. FIG. 2 is a vertical sectional view taken along line II-II in FIG. 1.

Referring to FIGS. 1 and 2, in an exemplary embodiment, the wafer inspection device 10 includes an inspection chamber 11. The inspection chamber 11 includes an inspection region 12 for inspecting electrical characteristics of a semiconductor device of a wafer W, a loading/unloading region 13 for loading and unloading the wafer W into and from the inspection chamber 11, and a transfer region 14 provided between the inspection region 12 and the loading/unloading region 13. A plurality of testers 15 as wafer inspection interfaces is arranged in the inspection region 12. A probe card 18 is attached to a lower portion of each of the testers 15.

The loading/unloading region 13 is partitioned into a plurality of accommodation spaces 16. In each of the accommodation spaces 16, there is arranged a container for accommodating a plurality of wafers W, for example, a port 16a for receiving a FOUP 17, a loader 16c for loading and unloading a probe card 18, or a controller 16d for controlling the operation of each component of the wafer inspection device 10.

In the inspection region 12, a chuck top 20 made of a plate-shaped member for mounting and attracting a wafer W is arranged in a corresponding relationship with each of the testers 15 so as to face the probe card 18. The chuck top 20 is supported by an aligner 21. The aligner 21 moves the chuck top 20 upward, downward, leftward and rightward, thereby allowing the wafer W mounted on the chuck top 20 to directly face the probe card 18.

A movable transfer robot 19 is disposed in the transfer region 14. The transfer robot 19 receives the wafer W from the port 16a of the loading/unloading region 13 and transfers the wafer W to the chuck top 20 corresponding to each of the testers 15. Furthermore, the transfer robot 19 transfers the wafer W, which has been subjected to inspection of electrical characteristics of a semiconductor device, from the chuck top 20 corresponding to each of the testers 15 to the port 16a. Moreover, the transfer robot 19 transfers the probe card 18 that needs maintenance from each of the testers 15 to the loader 16c of the loading/unloading region 13 and also transfers a new probe card 18 or a probe card 18 on which the maintenance has performed from the loader 16c to each of the testers 15.

In one embodiment, in the wafer inspection device 10, each tester 15 inspects the electrical characteristics of the semiconductor device of the transferred wafer. While the transfer robot 19 is transferring a wafer toward one tester 15, another tester 15 can inspect the electrical characteristics of the semiconductor device of another wafer. Therefore, it is possible to improve the wafer inspection efficiency.

Figure 3:
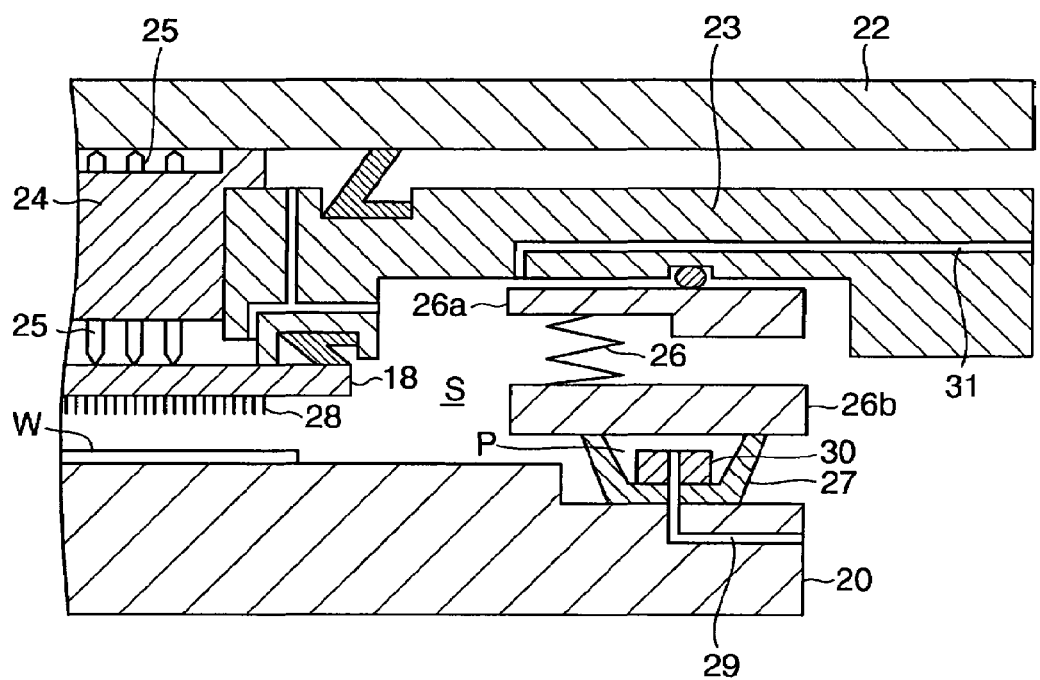
FIG. 3 is an enlarged partial sectional view of a lower portion of a tester in the wafer inspection device shown in FIG. 1.

FIG. 3 is an enlarged partial sectional view of the lower portion of the tester in the wafer inspection device shown in FIG. 1.

Referring to FIG. 3, the tester 15 may include a motherboard 22 arranged therein. The motherboard 22 has a structure imitating a motherboard of a personal computer or the like on which a semiconductor device to be subjected to inspection of electrical characteristics is mounted. The tester 15 uses the motherboard 22 to reproduce a state close to a state in which a semiconductor device is mounted on a motherboard of a personal computer or the like, and inspects the electrical characteristics of the semiconductor device.

A pogo frame 23 is disposed below the motherboard 22. A space between the motherboard 22 and the pogo frame 23 is depressurized so that the motherboard 22 attracts the pogo frame 23 by vacuum. Furthermore, the probe card 18 is disposed below the pogo frame 23. A space between the pogo frame 23 and the probe card 18 is depressurized so that the pogo frame 23 attracts the probe card 18 by vacuum.

A frame-shaped pogo block 24 is arranged in a central portion of the pogo frame 23. The pogo block 24 holds a large number of pogo pins 25 for electrically connecting the probe card 18 and the motherboard 22. The chuck top 20 is disposed below the probe card 18. The probe card 18 includes a large number of contact probes 28 arranged on a lower surface of the probe card 18 so as to face the chuck top 20. In the pogo frame 23, there is arranged a bellows 26, which is a cylindrical bellows member extending down toward the chuck top 20 so as to surround the respective contact probes 28. The bellows 26 may be configured to extend down from the probe card 18.

On the chuck top 20, a lip seal 27 (seal member) made of an elastomer member is arranged so as to surround the mounted wafer W and to face the bellows 26. Ring-shaped abutment portions 26a and 26b are provided respectively at upper and lower ends of the bellows 26. The ring-shaped abutment portion 26a abuts against the pogo frame 23, and the ring-shaped abutment portion 26b abuts against the lip seal 27. The lip seal 27 has a U-shaped cross section that opens upward. When abutting against the abutment portion 26b, the lip seal 27 forms a sealed space P surrounded by the abutment portion 26b and the lip seal 27. The sealed space P is depressurized through a depressurization path 29 that brings the sealed space P into communication with a first depressurization unit (not shown) provided outside. As a result, the lip seal 27 is attracted to the bellows 26 via the abutment portion 26b. A stopper 30 made of a hard member, for example, a resin member, having a predetermined height is disposed inside the lip seal 27. When the lip seal 27 is attracted to the abutment portion 26b, the stopper 30 prevents the lip seal 27 from being collapsed to less than a predetermined height. This makes it possible to prevent the restoration property of the lip seal 27 from decreasing due to over-compression.

In addition, the bellows 26 may be expanded and contracted in a vertical direction. The bellows 26 attracts the lip seal 27 via the abutment portion 26b, thereby forming a closed space S surrounded by the pogo frame 23, the bellows 26, the lip seal 27 and the chuck top 20. In the wafer inspection device 10, the closed space S is depressurized and contracted through an intake path 31 provided in the pogo frame 23 to bring the closed space S into communication with a second depressurization unit (not shown) provided outside. As a result, the chuck top 20 is attracted to the pogo frame 23, whereby the respective contact probes 28 of the probe card 18 arranged under the pogo frame 23 make contact with the electrode pads or the solder bumps of the semiconductor device of the wafer W mounted on the chuck top 20. At this time, electricity is allowed to flow from the respective contact probes 28 to the electric circuit of the semiconductor device connected to the respective electrode pads or the respective solder bumps, thereby inspecting electrical characteristics such as a conduction state of the electric circuit and the like.

FIGS. 4A to 4E are process diagrams for explaining the operations of the chuck top and the like in a substrate inspection method according to an embodiment of the present disclosure.

Figure 4A:
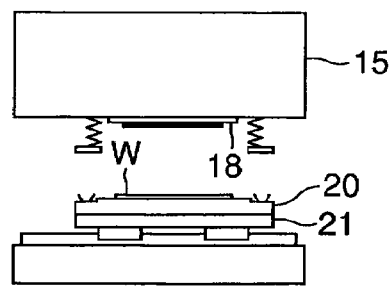
FIGS. 4A to 4E are process diagrams for explaining operations of a chuck top and the like in a substrate inspection method according to an embodiment of the present disclosure.
Figure 4B:
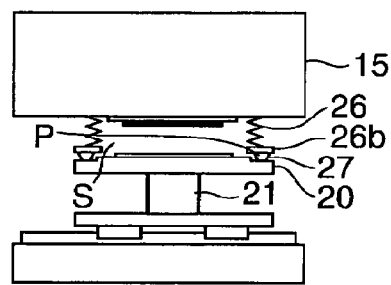

First, the chuck top 20 that received the wafer W from the transfer robot 19 is moved by the aligner 21, and the wafer W mounted on the chuck top 20 is caused to directly face the probe card 18 (FIG. 4A). Thereafter, when the aligner 21 is moved upward to bring the chuck top 20 close to the pogo frame 23 (the tester 15), the abutment portion 26b of the bellows 26 abuts against the lip seal 27. Thus, a sealed space P is formed between the abutment portion 26b and the lip seal 27, and a closed space S surrounded by the pogo frame 23 (the tester 15), the bellows 26, the lip seal 27 and the chuck top 20 is formed (FIG. 4B). At this time, neither the sealed space P nor the closed space S is depressurized.

Figure 4C:
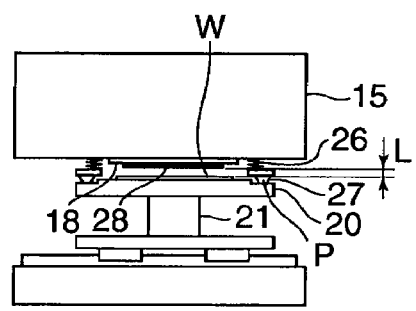

Next, the aligner 21 continues to move upward. Before the respective contact probes 28 of the probe card 18 disposed under the pogo frame 23 makes contact with the semiconductor device of the wafer W mounted on the chuck top 20 and after a distance L between the lower ends of the respective contact probes 28 and the respective electrode pads or the respective solder bumps of the semiconductor device becomes, for example, 30 μm or less, the sealed space P is depressurized by the first depressurization unit. Thus, the bellows 26 is attracted to the chuck top 20 via the lip seal 27, and the bellows 26 is rigidly integrated with the chuck top 20 (FIG. 4C).

Figure 4D:
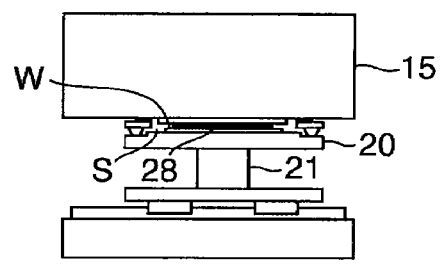

Furthermore, the aligner 21 continues to move upward, and brings the respective contact probes 28 into contact with the respective electrode pads or the respective solder bumps of the semiconductor device. Thereafter, the aligner 21 presses (overdrives) the chuck top 20 toward the pogo frame 23 (the tester 15) and continuously brings the respective contact probes 28 into contact with the respective electrode pads or the respective solder bumps. However, at this time, the closed space S is depressurized by the second depressurization unit, whereby the chuck top 20 is attracted to the pogo frame 23 (FIG. 4D).

Figure 4E:
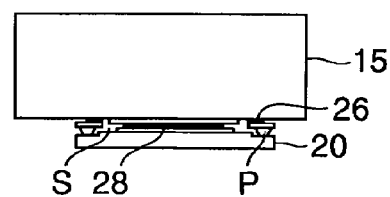

Subsequently, the aligner 21 moves downward. Since the closed space S is depressurized, the chuck top 20 continues to be attracted to the pogo frame 23 (the tester 15), and the respective contact probes 28 continue to make contact with the respective electrode pads or the respective solder bumps of the semiconductor device (FIG. 4E). Furthermore, in the present embodiment, even after the respective contact probes 28 make contact with the respective electrode pads or the respective solder bumps, the sealed space P is continuously depressurized, and the bellows 26 is continuously attracted to the chuck top 20. As a result, it is possible to reliably close the closed space S and to reliably prevent the contact between the respective contact probes 28 and the respective electrode pads or the respective solder bumps from being interrupted due to the increase in the pressure of the closed space S.

According to the substrate inspection method of the present embodiment, when bringing the chuck top 20 close to the pogo frame 23, the bellows 26 extending down from the pogo frame 23 so as to surround the contact probes 28 is attracted to the chuck top 20 via the lip seal 27 before the respective contact probes 28 make contact with the respective electrode pads or the respective solder bumps of the semiconductor device of the wafer W. Therefore, the bellows 26 can be rigidly integrated with the chuck top 20 before the respective contact probes 28 make contact with the respective electrode pads or the respective solder bumps. As a result, even if the reaction force from the respective contact probes 28 acts on the chuck top 20 via the respective electrode pads or the respective solder bumps after the respective contact probes 28 make contact with the respective electrode pads or the respective solder bumps, the rigidity of the bellows 26 can be contributed to counteract the reaction force. Thus, it is possible to prevent the chuck top 20 from being tilted or laterally moved by the reaction force from the respective contact probes 28, whereby the respective contact probes 28 can be appropriately brought into contact with the respective electrode pads or the respective solder bumps of the semiconductor device. As a result, it is possible to accurately inspect the electrical characteristics of the semiconductor device.

In the substrate inspection method according to the present embodiment described above, the bellows 26 continues to be attracted to the chuck top 20 even after the respective contact probes 28 make contact with the respective electrode pads or the respective solder bumps. Therefore, even during the overdrive, it is possible to keep the respective contact probes 28 in proper contact with the respective electrode pads or the respective solder bumps of the semiconductor device.

Furthermore, if the bellows 26 is attracted to the chuck top 20 considerably before the respective contact probes 28 come into contact with the respective electrode pads or the respective solder bumps, the rigidity of the bellows 26 hinders the approach of the chuck top 20 to the pogo frame 23. In some cases, there is a possibility that the respective contact probes 28 are out of alignment from the respective electrode pads or the respective solder bumps to be contacted. In the substrate inspection method according to the above-described embodiment, the bellows 26 is attracted to the chuck top 20 after the distance L between the lower ends of the respective contact probes 28 and the respective electrode pads or the respective solder bumps becomes 30 µm or less. As a result, it is possible to shorten the time during which the rigidity of the bellows 26 may hinder the approach of the chuck top 20 to the pogo frame 23, and it is possible to reliably bring the respective contact probes 28 into contact with the respective electrode pads or the respective solder bumps to be contacted.

Furthermore, in the substrate inspection method according to the present embodiment as described above, the bellows 26 is attracted to the lip seal 27 made of an elastomer member. Even though the bellows 26 is indirectly attracted to the chuck top 20 rather than directly, it is possible to reliably attract the bellows 26 to the chuck top 20. In addition, since the sealed space P between the abutment portion 26b and the lip seal 27 is depressurized, it is possible to reliably attract the bellows 26 to the lip seal 27.

Although the present disclosure has been described with reference to the above-described embodiments, the present disclosure is not limited to the above-described embodiments.

Figure 5:
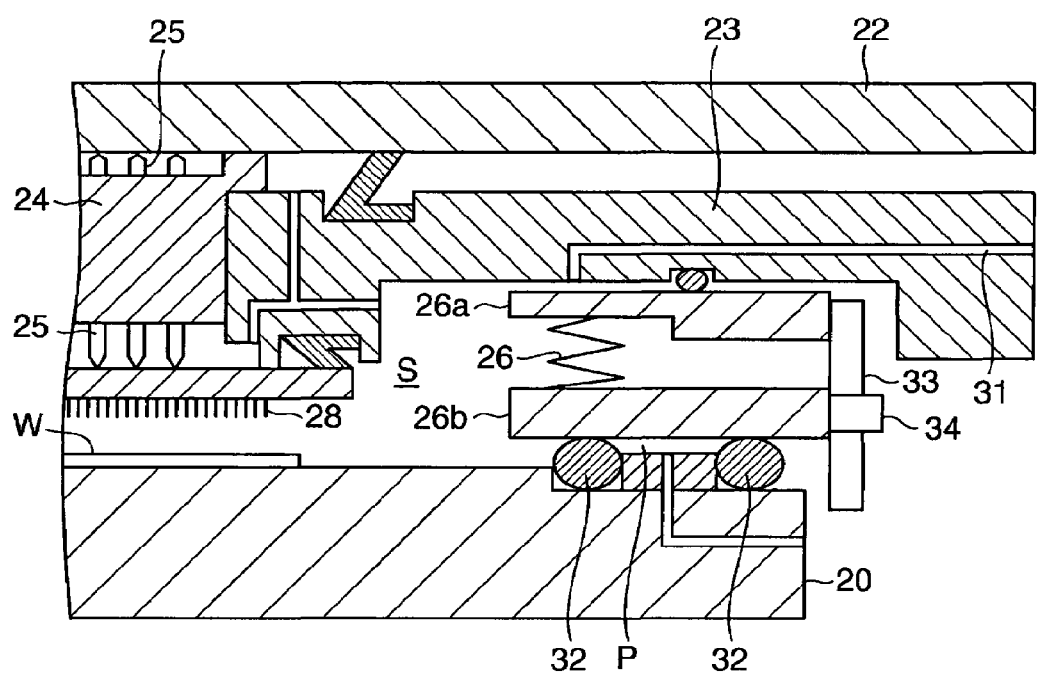
FIG. 5 is an enlarged partial sectional view of a lower portion of a tester in a modification of the wafer inspection device shown in FIG. 3.

For example, the sealed space P may be formed by the abutment portion 26b and the lip seal 27 having a U-shaped cross section. Instead of the lip seal 27, two O-rings 32 may be provided in the peripheral edge portion of the chuck top 20 (see FIG. 5), and the sealed space P may be formed by the two O-rings 32 and the abutment portion 26b.

Furthermore, by providing a guide rail 33 extending along the expansion/contraction direction of the bellows 26 and a guide 34 loosely engaging with the guide rail 33, joining an upper end of the guide rail 33 to the abutment portion 26a and joining the guide 34 to the abutment portion 26b, it is also possible to prevent the deviation of the abutment portion 26b (in particular, the deviation in the horizontal direction) during expansion and contraction of the bellows 26. In this case, in addition to the bellows 26, the guide rail 33 may also be rigidly integrated with the chuck top 20 after the bellows 26 has been attracted to the chuck top 20. This makes it possible to reliably prevent the chuck top 20 from being tilted or laterally moved.

Figure 6:
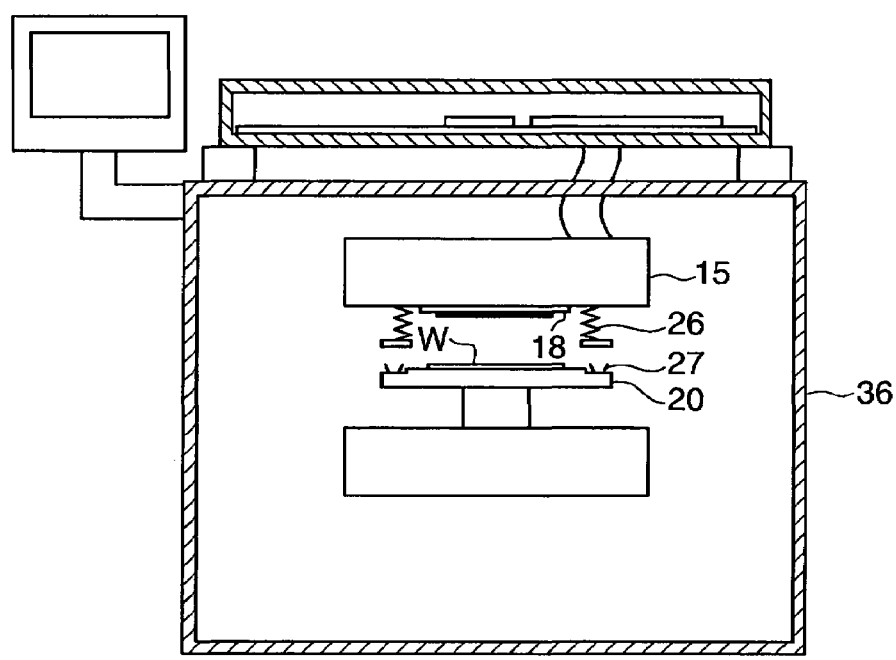
FIG. 6 is a sectional view schematically showing a configuration of another wafer inspection device to which the present disclosure is applied.
Figure 7A:
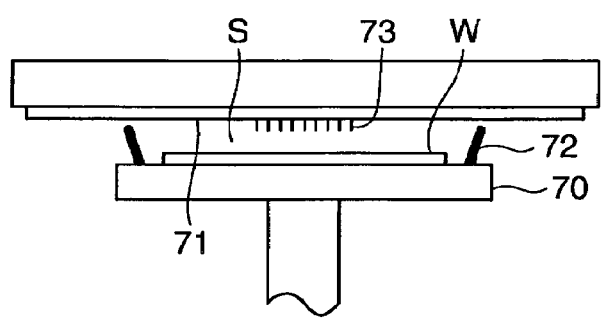
FIGS. 7A to 7D are diagrams for explaining operations of a chuck top and the like in a conventional wafer inspection device.
Figure 7B:
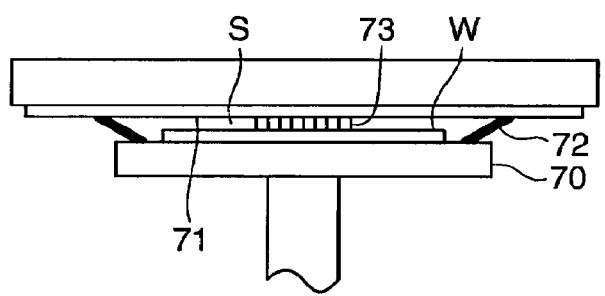
Figure 7C:
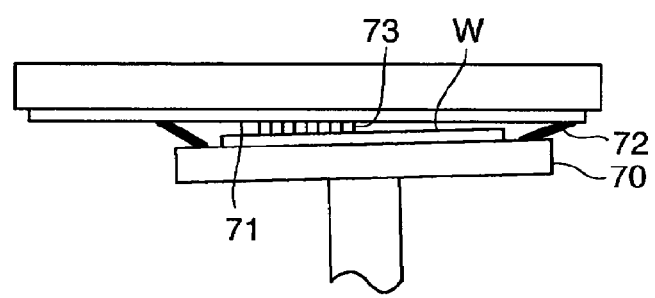
Figure 7D:
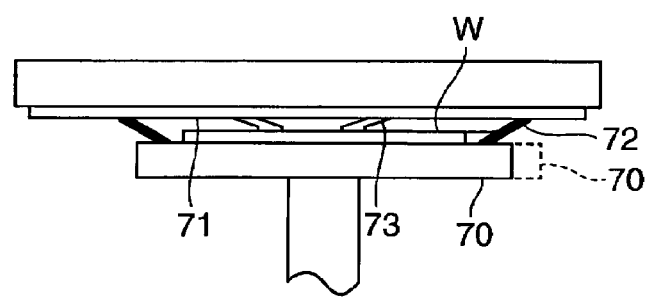

Moreover, the present disclosure may be applied to the wafer inspection device capable of inspecting electrical characteristics of semiconductor devices of a plurality of wafers at the same time. However, the present disclosure is applicable to a wafer inspection device for inspecting electrical characteristics of a semiconductor device of only one wafer. In this case, the wafer inspection device 35 may include a tester 15 (pogo frame 23), a probe card 18, a chuck top 20, a bellows 26 and a lip seal 27 in one inspection chamber 36 (see FIG. 6).

This application claims priority based on Japanese Patent Application No. 2016-184258 filed on Sep. 21, 2016, the entire contents of which are incorporated herein by reference.

EXPLANATION OF REFERENCE NUMERALS

P: sealed space, S: closed space, W: wafer, 10, 35: wafer inspection device, 18: probe card, 20: chuck top, 23: pogo frame, 26: bellows, 26b: abutment portion, 27: lip seal, 32: O-ring, 33: guide rail, 34: guide

What is claimed is:

1. A substrate inspection method for use in a substrate inspection device including a plate-shaped member on which a substrate having a device formed thereon is mounted and a probe card disposed above the plate-shaped member so as to face the plate-shaped member, the probe card including a plurality of needle-shaped contact probes protruding toward the substrate, the substrate inspection device configured to bring the plate-shaped member close to the probe card to bring the contact probes into contact with the device, the substrate inspection method comprising:
arranging a tubular expandable/contractible bellows extending downward so as to surround the plurality of needle shaped contact probes;
arranging a lip seal having a U-shaped cross section opened toward the bellows on the plate-shaped member so as to surround the substrate;
arranging a stopper inside the lip seal; and
attracting the bellows to the lip seal when bringing the plate-shaped member close to the probe card, before the contact probes come into contact with the device.

2. The method of claim 1, wherein the bellows is kept attracted to the lip seal even after the contact probes come into contact with the device.

3. The method of claim 1, wherein after a distance between the contact probes and the device becomes 30 µm or less, the bellows is attracted to the lip seal.

4. The method of claim 1, wherein a sealed space, which is surrounded by the bellows and the lip seal, is formed, and the bellows is attracted to the lip seal by depressurizing the sealed space.

5. The method of claim 1, wherein the bellows is attracted to the lip seal to form a closed space surrounded by at least the probe card, the bellows, the lip seal and the plate-shaped member, and the closed space is depressurized to attract the plate-shaped member to the probe card and to bring the contact probes into contact with the device.

6. A substrate inspection device including a plate-shaped member on which a substrate having a device formed thereon is mounted and a probe card disposed above the plate-shaped member so as to face the plate-shaped member, the probe card including a plurality of needle-shaped contact probes protruding toward the substrate, the substrate inspection device configured to bring the plate-shaped member close to the probe card to bring the contact probes into contact with the device, the substrate inspection device comprising:
a tubular expandable/contractible bellows extending downward so as to surround the plurality of needle shaped contact probes; and
a lip seal disposed on the plate-shaped member so as to surround the substrate,
wherein the lip seal has a U-shaped cross section opened toward the bellows,
a stopper is arranged inside the lip seal, and
the bellows is attracted to the lip seal when bringing the plate-shaped member close to the probe card, before the contact probes come into contact with the device.

7. The device of claim 6, wherein a sealed space, which is surrounded by the bellows and the lip seal, is formed, and the bellows is attracted to the lip seal by depressurizing the sealed space.

8. The device of claim 6, further comprising:
a guide rail extending in an expansion/contraction direction of the bellows,
wherein, when the bellows expands and contracts, the bellows is guided by the guide rail.

* * * * *